United States Patent [19]

Fraas

[11] Patent Number: 4,751,372
[45] Date of Patent: Jun. 14, 1988

[54] VACUUM CHAMBER HEATER APPARATUS

[75] Inventor: Lewis M. Fraas, El Sobrante, Calif.

[73] Assignee: Daido Sanso K.K., Osaka, Japan

[21] Appl. No.: 940,998

[22] Filed: Dec. 12, 1986

[51] Int. Cl.$^4$ .............................................. H05B 3/10
[52] U.S. Cl. .................................. 219/553; 219/347; 219/354
[58] Field of Search ............... 219/347, 354, 355, 356, 219/532, 390, 405, 411, 553; 118/724, 725, 50.1

[56] References Cited

U.S. PATENT DOCUMENTS

| 4,207,456 | 6/1980 | Best | 219/354 |
| 4,531,047 | 7/1985 | Canfield et al. | 219/347 |

OTHER PUBLICATIONS

L. M. Fraas et al., "Vacuum Chemical Epitaxy Utilizing Organomablic Sources,", J. Elec. Materials, vol. 15, No. 3, pp. 175–180, May 1986.
L. D. Partain et al., "Vacuum MOCVD Fabrication of High Efficiency Cells for Multi-Junction Application", Space Photovoltaic Research & Tech. Conference, Apr. 30–May 2, 1985, pp. 1–9.
Research on Multiband Gap Solar Cells, SERI Semiannual Control Report, Mar. 31, 1985 to Aug. 31, 1985, submitted on or about Oct. 16, 1985 for initial approval and mailed to listed recipients on or about Dec. 16, 1985.

*Primary Examiner*—Harold Broome
*Attorney, Agent, or Firm*—Armstrong, Nikaido, Marmelstein & Kubovcik

[57] ABSTRACT

A heater apparatus particularly suitable for use in a vacuum deposition apparatus is disclosed. The heater apparatus contains an open structure surrounding the heating element to permit quick evacuation of the apparatus and avoid memory problems attendant with sealed heater tubes used in a high vacuum environment which is repeatedly cycled from vacuum to ambient pressure.

9 Claims, 1 Drawing Sheet

U.S. Patent        Jun. 14, 1988        4,751,372
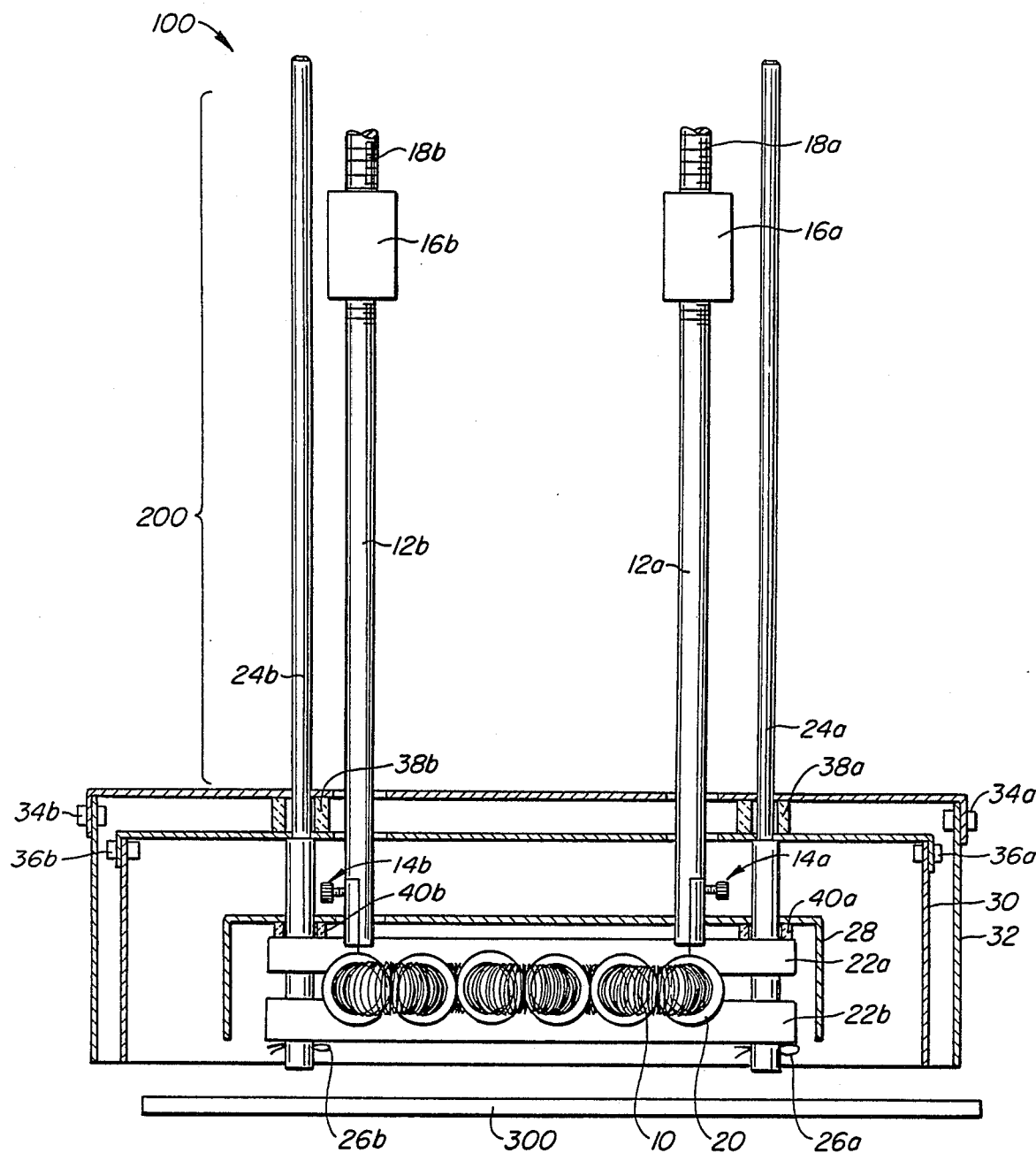
FIGURE

VACUUM CHAMBER HEATER APPARATUS

This invention relates to a heater apparatus. More specifically, this invention relates to a heater apparatus for use in a vacuum chamber and particularly to an apparatus for use in a vacuum chemical epitaxi, (VCE), system.

BACKGROUND OF THE INVENTION

Many industrial processes require uniform heating of work pieces. Often, the work pieces must be heated to an elevated temperature in order to accelerate a reaction. Heating a work piece in a vacuum presents particularly difficult problems because the heat transfer efficiency is reduced as the vacuum increases. Many of the processes which are used in the semiconductor industry require tremendously pure environments to avoid contaminating the work piece, e.g., semiconductor substrate, from deleterious side reactions, by products, or heating apparatus degradation contaminants.

Previous apparatus for heating substrates in a vacuum environment encase a standard heater wire in a silica quartz tube. The heater is placed above the substrate and energized to heat the substrate. Because the heating element and the silica or quartz tube expand at different rates because of their different thermal coefficients of expansion, the seal between the silica or quartz shield and the heating element develops micro cracks. When the seal between the heating element and silica or quartz tube breaks this permits the pressure within the tube to rise to ambient conditions when the vacuum environment is terminated. The lack of pressure within the tube equalizes with the surrounding environment by the uptake of gases in the chamber. When the apparatus is used again, the out gassing of the contaminants from the tube results in memory problems and other deleterious side effects to the environment within the vacuum chamber. This destroys or degrades the purity of the vacuum and can cause contamination of the semiconductor device being fabricated.

III-V compound semiconductor such as GaAs/AlGaAs devices are of particular interest because of their increased efficiency. Standard quartz heater tubes present particular problems with the fabrication of these devices because the gases used to create the layers in the device react with the silica or quartz. This degrades the environment and increases the problems associated with fabricating high quality semiconductor devices. In addition, the standard copper heater contacts on the outside of the heating lamps forms a gallium copper alloy which quickly reduces efficiency of the heater and drastically shortens its lifetime.

Thus, it would be highly desirable to have an apparatus which can uniformly heat the semiconductor substrate without exposing the environment to unnecessary contaminants or residual dopants from previous manufacturing processes. It would also be desirable to have an apparatus having a modular construction so that individual components can be easily and quickly replaced to minimize the down time of the apparatus.

SUMMARY OF THE INVENTION

The invention possesses the above-mentioned desirable properties and also possesses many other beneficial aspects obvious to the skilled artisan from the following description. More specifically, the heater apparatus contains an open modular construction of materials which are particularly inert to III-V compound semiconductor gases. The open structure of the apparatus avoids memory problems within the reaction chamber and permits a faster and more efficient evacuation of the deposition apparatus.

BRIEF DESCRIPTION OF THE DRAWING

The FIGURE illustrates a cross-sectional view of a generalized embodiment of the invention.

DETAILED DESCRIPTION OF THE INVENTION

The heater apparatus will be more clearly illustrated by referring to the FIGURE. The complete apparatus is illustrated as 100. The apparatus 100 includes a heater filament means 10 such as a tungsten rhenium heating wire. A tungsten rhenium heater wire is preferred because of its ability to survive in the gaseous atmosphere of the vacuum chamber. However, as the reactive metallorganic gases are changed such that side reactions or alloys might form with the heater wire, any suitable heater wire can be utilized for the radiative heating, i.e., black body radiation, of the substrate.

Surrounding the heater wire 10 is an insulating tube 20 preferably of a material such as sapphire, i.e., $Al_2O_3$, which permits the infrared radiation generated by the heater wire 10 to pass therethrough and be absorbed by heat spreader plates 22a and 22b. The heat spreader plates 22a and 22b are selected to provide good black body radiation without adversely reacting with the gases in the deposition apparatus. Suitable heat spreader plates are made of molybdenum blocks machined to accept the insulating tubes 20 as illustrated.

The open configuration of the insulating tubes 20 permits the rapid evacuation of the apparatus and avoids the memory problems common to sealed heating filaments when the seal cracks between the insulator and the heater filament. I first recognized that it was possible to use the open configuration because the vacuum within the chamber is on the order of a magnitude lower pressure or better, i.e., $10^{-6}$ to $10^{-8}$ Torr, than the vacuum used in evacuated heating filaments. In addition, the sapphire material used for the insulator avoids contamination by reactions of the gaseous products with common quartz or silica tubes. Of course any other suitable electrically insulating material which does not adversely react with the semiconductor gases is suitable for use in the invention.

The heater wire 10 is attached to its energizing contacts 12a and 12b by quick attachment means 14a and 14b which comprise a split in the energizers 12a and 12b and thumb screws 14a and 14b. The quick attachment means 14a and 14b permit the easy replacement of the heater wire 10 in the event that different heater wires are necessary or replacement is required. The contacts 12a and 12b are preferably fabricated from molybdenum or other suitable nonreactive material.

The invention departs from prior heating systems by utilizing molybdenum instead of copper. I discovered that copper forms a soft copper gallium alloy of higher resistance which correspondingly decreases the contacts electrical carrying capacity and lifetime. The contacts 12a and 12b are connected to the outside of the vacuum apparatus through connecting means 16a and 16b. Suitable connecting means are bolts or swage fittings having threads. Heavy copper wires 18a and 18b are connected to the molybdenum contact rods 12a and 12b through nuts 16a and 16b.

The configuration of the heater apparatus 10 can take on any form which is capable of overlaying and uniformly heating the portion of the substrate 300 on which the necessary semiconductor devices are formed.

In this particular embodiment, the apparatus 100 has a rectangular configuration. The heater is held together by four spacers of which only two, 24a and 24b, are illustrated because of the cross-sectional view. A suitable example for the spacers are rods or bars of molybdenum. The spacer bars are provided with a quick disconnect to the heat spreader plates 22a and 22b by, for example, cotter pins 26a and 26b or other suitable means. The four spacer bars also hold the heater in place within the deposition apparatus. The distance 200 is adjusted from the wall of the vacuum chamber to the heater 100 and substrate 300 so as to minimize the heating of the vacuum chamber. In other words, the vacuum apparatus is not, in the preferred embodiment, a hot wall reactor. Of course if the quick disconnect feature is not desired, the bars can be welded, brazed, or screwed in place or any other high temperature bonding technique.

Since the effectiveness of the heater varies as to the fourth power of its output, it is highly desirable to minimize the heater size and avoid the requirement of increased cooling capacity and power requirements. Thus, the apparatus 100 includes heater shields 28, 30, and 32. Heat shields 30 and 32 are quickly disassembled by nuts 34a/34b and 36a/36b to permit access to the inner portion of the apparatus. Heat shields 30 and 32 are spaced apart by spacers 38a and 38b. The inner heat shield 28 is spaced from the heater plate 22a by spacers 40a and 40b.

The invention is described with reference to particularly preferred embodiments. Modification within the broad general concepts of the teachings are intended to be within the scope of the invention.

What is claimed is:

1. A heater apparatus for use within a vacuum disposition apparatus comprising:
   a heater wire;
   open insulating means surrounding said heater wire and having a length;
   molybdenum heat spreader plate means engaging said insulating means along said length for spreading the heat generated by said heater wire;
   means connected to said spreader plates means for locating said heat spreader plate means within the vacuum deposition apparatus; and
   means attached to said heater wire for making an electrical contact to said heater wire.

2. The apparatus according to claim 1 wherein said insulating means are tubular sapphire members.

3. The apparatus according to claim 2 wherein said means for making the electrical contact to said heater wire are molybdenum rods.

4. The apparatus according to claim 3 further comprising means for quickly connecting and disconnecting to said heater wire to said molybdenum rods.

5. The apparatus according to claim 4 wherein said means for locating said heat spreader plate means are molybdenum rods.

6. The apparatus according to claim 5 further comprising means for connecting and disconnecting said molybdenum rods from said heat spreader plate means.

7. The apparatus according to claim 6 further comprising one or a plurality of heat shields surrounding said heat spreader plate means on sides thereof not in radiative heat communication with a substrate.

8. A vacuum chamber heater apparatus comprising:
   a tungsten-rhenium heater wire;
   molybdenum electrical contacts contacting said heater wire such that electrical current can be passed through a wall of a vacuum chamber to energize said heater wire;
   $Al_2O_3$ tubular insulating means surrounding said heater wire and having a length;
   molybdenum heat spreader plate means engaging said $Al_2O_3$ tubular insulating means along said length for spreading the heat generated by said heater wire;
   molybdenum rods for locating said heat spreader plate means within said vacuum chamber apparatus;
   means for connecting and disconnecting said molybdenum rods from said heat spreader plate means; and
   one or a plurality of heat shields surrounding said heat spreader plate means on sides thereof not in radiative heat communication with a substrate.

9. The apparatus according to claim 8 further comprising means for connecting and disconnecting said molybdenum electrical contact from said tungsten-rhenium heater wire.

* * * * *